(12) United States Patent
Garcia

(10) Patent No.: US 6,169,663 B1
(45) Date of Patent: *Jan. 2, 2001

(54) INTEGRATED CIRCUIT CONNECTION USING AN ELECTRICALLY CONDUCTIVE ADHESIVE

(75) Inventor: Steven E. Garcia, League City, TX (US)

(73) Assignee: Medallion Technology, LLC, Houston, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/041,572

(22) Filed: Mar. 12, 1998

(51) Int. Cl.[7] .................................................. H05K 3/36
(52) U.S. Cl. .................. 361/760; 361/764; 361/765; 361/767; 361/807; 257/698; 257/697; 257/773; 257/774; 174/250; 174/255; 174/266; 228/180.22
(58) Field of Search ..................... 361/760, 764, 361/765, 767, 748, 749, 771, 792, 807, 743; 257/697, 698, 774, 773, 782, 784, 686; 228/180.22; 174/250, 254, 255, 259, 266

(56) References Cited

U.S. PATENT DOCUMENTS

| 5,054,192 | | 10/1991 | Cray et al. ............................. 29/835 |
|---|---|---|---|
| 5,450,290 | * | 9/1995 | Boyko et al. ......................... 361/792 |
| 5,460,531 | * | 10/1995 | Vivio ....................................... 439/70 |
| 5,468,681 | * | 11/1995 | Pasch ..................................... 438/108 |
| 5,483,421 | * | 1/1996 | Gedney et al. ....................... 361/771 |
| 5,907,903 | * | 6/1999 | Ameen et al. .......................... 29/830 |

* cited by examiner

Primary Examiner—Jeffrey Gaffin
Assistant Examiner—David Foster
(74) Attorney, Agent, or Firm—John R. Ley; Roger Fulghum

(57) ABSTRACT

A method and apparatus is provided for electrically and mechanically interconnecting electronic circuit assemblies or electronic modules. An integrated circuit (300) includes a plurality of leads (302) extending from a surface (305), each of the leads (302) having a seating portion (403) and a stem portion (402). A printed circuit board (400) includes a plurality of plated through holes (401) therein corresponding to the plurality of leads (302) extending from the integrated circuit (300). The steps of the method include positioning the printed circuit board (400) so that a lower surface (404) of the printed circuit board (400) rests on the seating portion (403) of the leads (302) of the integrated circuit (300), and so that the stem portion (302) of each of the leads are positioned within the corresponding plated through holes (401) in the printed circuit board (400). An electrically conductive epoxy adhesive (602) is then dispensed into the holes (401) having the leads (302) therein, and cured to form a solid, electrical, and mechanical connection between the printed circuit board (400) and integrated circuit (300).

35 Claims, 4 Drawing Sheets

INTEGRATED CIRCUIT CONNECTION USING AN ELECTRICALLY CONDUCTIVE ADHESIVE

TECHNICAL FIELD OF THE INVENTION

The present invention relates to the field of electronic circuit interconnection, and more specifically, to a new apparatus and method for electrically connecting integrated circuits to other electrical circuits, such as printed circuit boards or flexible circuits.

BACKGROUND OF THE INVENTION

Integrated circuits typically are packaged within hermetically sealed packages from which a multiplicity of pins extend. These pins are typically electrically connected to the signal, power, and ground lines of the integrated circuit, and provide a means by which the integrated circuit can be electrically connected to other electrical circuits. For example, integrated circuits can be electrically connected to one another to form larger circuits by soldering the pins of the integrated circuits to "plated through holes" (PTH) in a printed circuit board. Plated through holes are physical holes through the printed circuit board. The exterior of the plated through holes is comprised of an electrically conductive material. Each of these plated through holes may be electrically coupled to other electronic devices on the printed circuit board by interconnect lines in the printed circuit board. The soldering process forms the electrical and mechanical connection necessary to interconnect the integrated circuits and the printed circuit board. Similarly, in the case of multilayer printed circuit boards, plated through holes provide for the electrical connection between the electrical layers of the printed circuit board.

The above-described methods of interconnecting individually packaged integrated circuits using printed circuit boards imposes limits on the packaging density that can be achieved, since both the individual packaging of the integrated circuits and soldering methods used to form connections have inherent inefficiencies associated with them. The inability to provide a higher packaging density requires unnecessarily long interconnect lines in the printed circuit board, which adversely affects the inter-circuit signal speed and quality.

One means by which packaging density has been improved is through a method in which unpackaged integrated circuits are placed directly onto printed circuit boards by using soft "flying" gold lead wires attached to the bonding pads, or bond pads, of the integrated circuit to form the electrical and mechanical connection between the integrated circuit and the printed circuit board. This interconnection is achieved by inserting the flying gold leads into the plated through holes in the printed circuit board, and compressing the flying gold leads within the holes so that they buckle and contact the electrically conductive walls of the plated through holes, thereby forming the mechanical and electrical connections between the integrated circuit and the printed circuit board, or between multiple layers of a multilayer printed circuit board. This "pressing" method is fully described in U.S. Pat. No. 5,054,192 to Cray et al., which is incorporated herein by reference.

According to the pressing method described by U.S. Pat. No. 5,054,192 ("the '192 patent"), the flying gold leads are first secured to the integrated circuit board by thermosonically bonding them to the bonding pads of the integrated circuit so that they extend substantially perpendicularly from the integrated circuit. The integrated circuit is then positioned relative to the printed circuit board (which is secured to a lower caul plate) so that the flying gold leads each extend through a corresponding plated through hole in the printed circuit board, as shown in FIG. 1. Pressure is then applied to the upper surface of the integrated circuit through an upper plate, so that the flying gold leads are forced to buckle within the plated through holes in the printed circuit board, as shown in FIG. 2. Once the flying gold leads buckle, they contact the electrically conductive inner surface of the plated through holes, and electrically and mechanically connect the integrated circuit to the printed circuit board.

Although the invention of the '192 patent enables higher packaging densities to be achieved, there are several disadvantages associated with the fact that mechanical pressure must be applied to the integrated circuit and printed circuit board to force the flying gold leads to buckle within the plated through holes in the printed circuit board. First, the application of pressure to the integrated circuit results in compression of the flying gold leads directly onto the bond pads. Typically, the bond pads are not designed to withstand these types of mechanical forces. The bond pads themselves are often mechanically fragile, and mechanical loading on the surface of the bond pads can cause cratering, pad lift defects, where the pad lifts at least partially away from the surface of the integrated circuit, or both. Bond pad cratering may result in further mechanical and electrical fragility in the bond pad, making the bond pad more susceptible to future failure. Pad lift defects may result in electrical shorts.

Another problem associated with the pressing method described in the '192 patent is that it is essential that each of the flying gold leads be precisely perpendicular to the integrated circuit and printed circuit board, and be of a precise and uniform length. Any deviation may result in inconsistencies in the electrical connections among the flying gold leads, and adversely affect performance.

Another significant disadvantage of the invention of the '192 patent is that it makes removal and replacement of integrated circuits often difficult. To remove an integrated circuit, each and every gold lead must be dislodged from the corresponding plated through hole in the printed circuit board. This is accomplished by stamping or pressing out each gold lead, which is the reverse of the process used to buckle the gold lead. This forceful removal will result in damage to the flying gold leads, and will likely also result in damage to the bonding pads, the integrated circuit, and/or the plated through holes in the printed circuit board.

Accordingly, a need currently exists for an improved apparatus and method for interconnecting electronic circuit assemblies such as integrated circuits, printed circuit boards, including multilayer printed circuit boards, and flexible circuits.

SUMMARY OF THE INVENTION

The present invention provides such an improved method and apparatus. One such method is for electrically and mechanically connecting a first and second electronic circuit assembly. The first electronic circuit assembly includes a first surface having a plurality of leads extending therefrom and a second opposite surface. The plurality of leads each have a seating portion that is in communication with the first surface, and a stem portion extending from the seating portion. The second electronic circuit assembly includes a plurality of plated through holes therein corresponding to the plurality of leads of the first electronic circuit assembly. The steps of the method include positioning the second electronic assembly so that a lower surface of the second electronic assembly rests on the seating portion of the leads of the first electronic assembly, and so that the stem portion of each of the leads are positioned within the corresponding plated through holes in the second electronic assembly. An electrically conductive epoxy adhesive is then dispensed into each of the plated through holes having the stem portion of the leads therein, and cured to form a solid electrical and mechanical connection between the first and second electronic circuit assemblies.

DETAILED DESCRIPTION

As indicated above, the apparatus and method of the present invention involves the direct interconnection of various electronic circuit assemblies, and can be applied to interconnecting unpackaged integrated circuits and printed circuit boards. The present invention uses an electrically conductive epoxy adhesive rather than solder to form the electrical and mechanical connections between the electronic circuit assemblies. Although the present invention will be described below in relation to interconnection of integrated circuits and printed circuit boards, or interconnection of multiple printed circuit boards, it is to be understood that the invention is not so limited. For example, integrated circuits, or other electronic devices, may also be interconnected to other types of devices, such as flexible circuits. Further, although the integrated circuits are described below as including flying gold leads through which an electrical connection is made, any suitable leads may also be used without departing from the scope of the invention.

Figure 1:
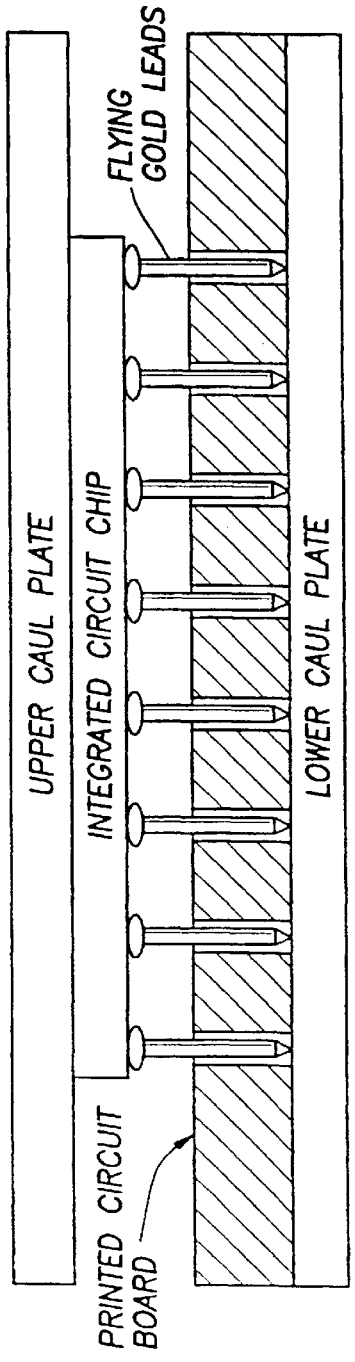
FIG. 1 illustrates an integrated circuit with flying gold leads positioned relative to a printed circuit board just prior to interconnection according to the prior art pressing method.
Figure 2:
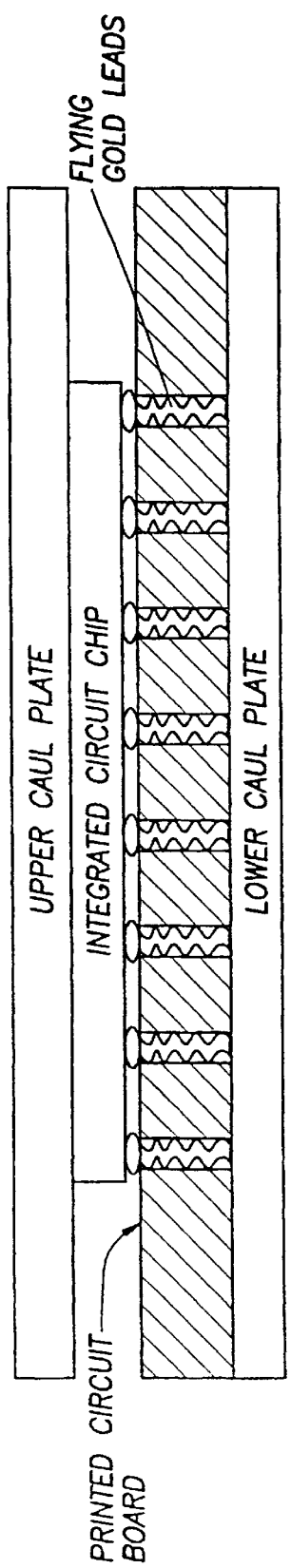
FIG. 2 is a side view illustrating the integrated circuit and printed circuit board of FIG. 1 that have been interconnected using the prior art pressing method.
Figure 3:
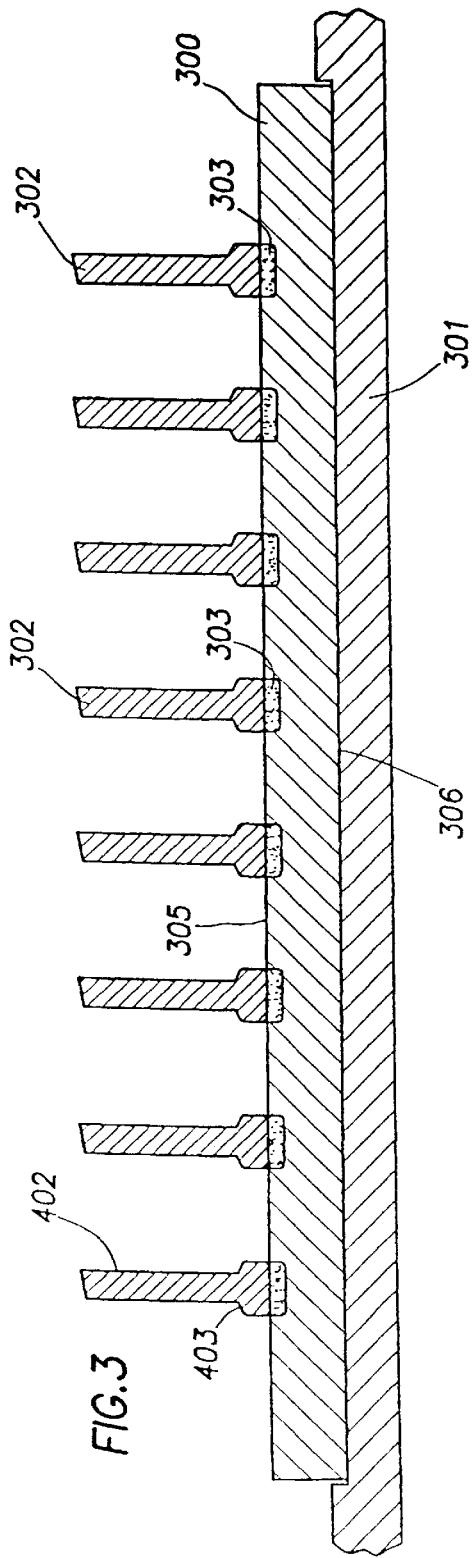
FIG. 3 illustrates an integrated circuit with flying gold leads positioned on a positioning plate.

Referring now to FIG. 3, the integrated circuit 300 includes a first surface 305 and a second opposite surface 306. Imbedded within the first surface is a plurality of bonding pads 303, to each of which a flying gold lead 302 is bonded, and, in one embodiment, extends substantially perpendicularly from the first surface 305. Although bond pads 303 are embedded in the surface of first surface 305 and a dotted line of the outline of bond pads 303 is shown in FIG. 3. The flying gold leads 302 may be bonded to the bonding pads 303 of the integrated circuit in the manner described in the '192 patent, which has been incorporated herein by reference. Once the flying gold leads 302 are attached to the bonding pads 303, the integrated circuit 300 can be positioned against a positioning plate 301 as shown in FIG. 3. The integrated circuit is positioned so that the flying gold leads 302 extend vertically upwards from the integrated circuit, and the second surface 306 of the integrated circuit rests against the positioning plate 301 and remains stationary. This may be accomplished by using a vacuum fixture for a positioning plate, such as a stainless steel vacuum caul plate. Once the integrated circuit 300 with flying gold leads 302 is nested into the positioning plate 301, a vacuum is applied to prevent any movement of the integrated circuit during the interconnection procedure.

Figure 4:
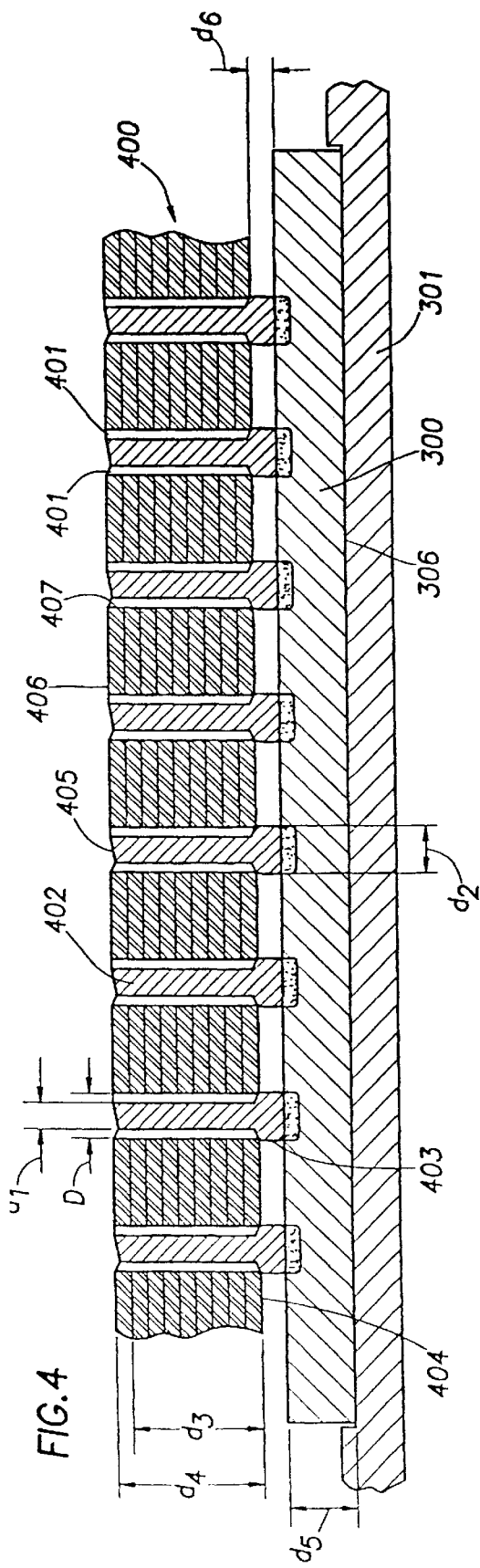
FIG. 4 illustrates an integrated circuit positioned relative to a printed circuit board prior to electrical interconnection.
Figure 5A:
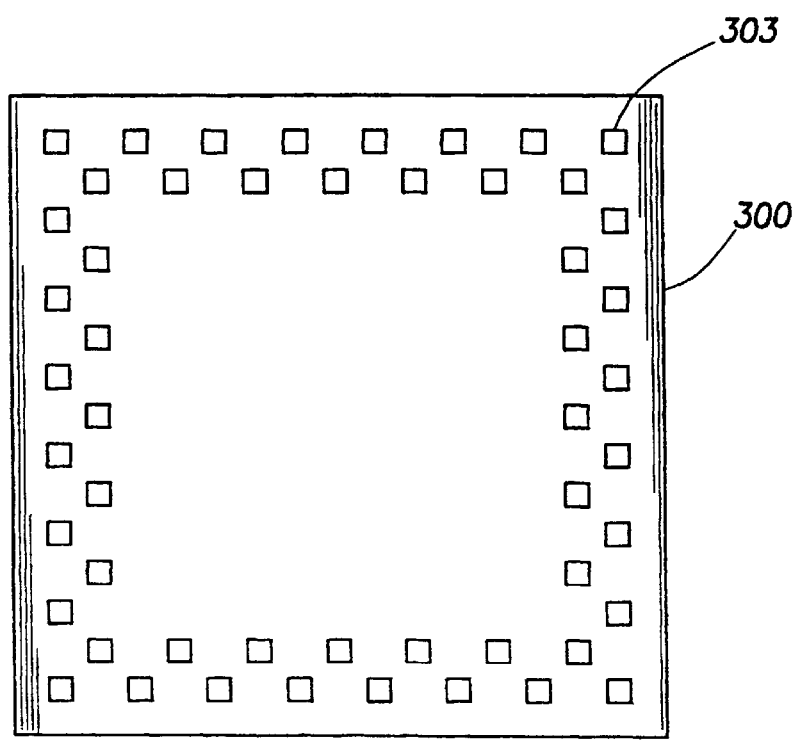
FIG. 5a illustrates a pattern of bonding pads on an integrated circuit.
Figure 5B:
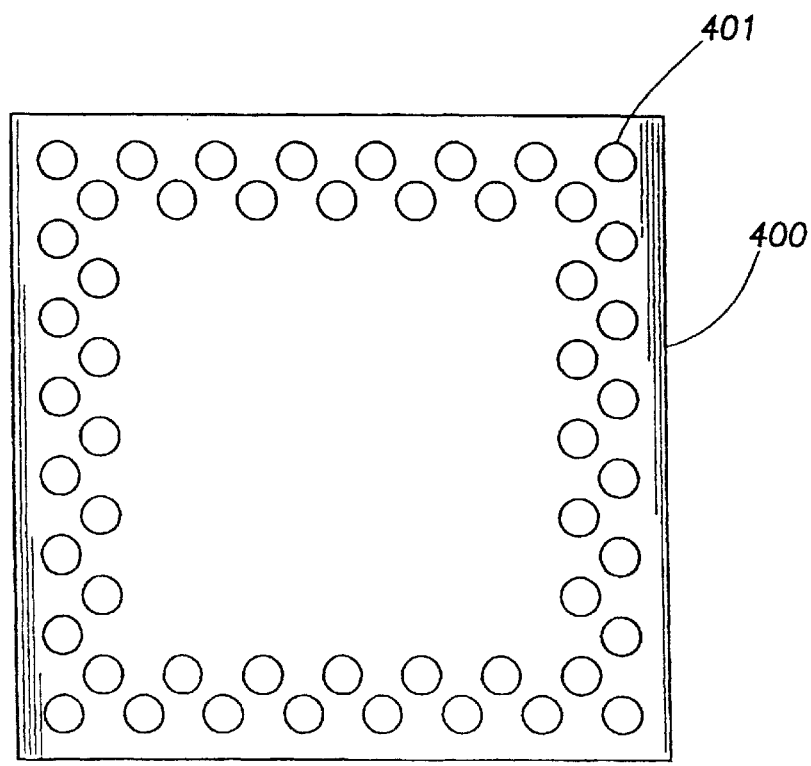
FIG. 5b illustrates a pattern of plated through holes in a printed circuit board.

Once the integrated circuit is securely positioned, the printed circuit board 400 is next positioned relative to the integrated circuit 300 so that the flying gold leads 302 extend into the plated through holes 401 in the printed circuit board, as shown in FIG. 4. The printed circuit board 400 is configured so that the pattern of plated through holes 401 matches the pattern of bonding pads 303 on the integrated circuit. These corresponding patterns can be seen in FIGS. 5a and 5b, wherein FIG. 5a illustrates a integrated circuit 300 having a plurality of bonding pads 303, and FIG. 5b illustrates a printed circuit board 400 having a matching pattern of plated through holes 401. Thus, when flying gold leads 302 are bonded to each of the bonding pads 303 of the integrated circuit so that they extend perpendicularly from the integrated circuit (see FIG. 3), it is apparent that the pattern of the flying gold leads 302 will also match the pattern of the plated through holes 401 in the printed circuit board.

An alternative method for placing the flying gold leads into the plated through holes involves the use of known flip-chip assembly, such as an automated flip chip bonder. The bonder could, with a high degree of accuracy and repeatability, retrieve and place integrated circuits with flying gold leads into the plated through holes of a printed circuit board. Using an automated flip chip bonder may alleviate some errors caused by the manual positioning plate process described above. Any suitable method for physically and accurately placing the flying gold leads into the plated through holes is within the scope of the present invention.

In order for the flying gold leads 302 to each extend into a corresponding plated through hole 401 in the printed circuit board, as illustrated in FIG. 4, the diameter D of the plated through holes 401 must be greater than the diameter $d_1$ of the stem portion 402 of the flying gold leads 302. The flying gold leads also include a seating portion 403 that has a diameter $d_2$ that is greater than the diameter D of the plated through hole 401. Thus, when the printed circuit board is positioned so that the stem portion of the flying gold leads extend into the plated through holes, the lower surface 404 of the printed circuit board rests on the seating portion 403 of the flying gold leads. The stem of the gold lead is of a length L that is less than the width W of the printed circuit board so that the end 405 of the gold lead does not protrude beyond the top surface 406 of the printed circuit board. The end of flying gold lead 302 opposite seating portion 403 may be canted, in one embodiment of the invention, at an approximately 11° angle. In one embodiment of the invention, the diameter D of plated through holes 401 is 0.005 inches and diameter $d_1$ of the stem portion of the flying gold lead 302 is 0.003 inches.

The dimensions of other elements of the embodiment of the invention of FIG. 4 are indicated in FIG. 4. The thickness $d_4$ of the printed circuit board 400 is 0.0157 inches, and the thickness $d_3$ of all but the topmost layer of printed circuit board 400 is 0.015 inches. The thickness $d_5$ of integrated circuit 300 is 0.008 inches, and the distance between integrated circuit 300 and the lower surface 404 of printed circuit board 400, $d_6$, is 0.0035 inches.

Figure 6:
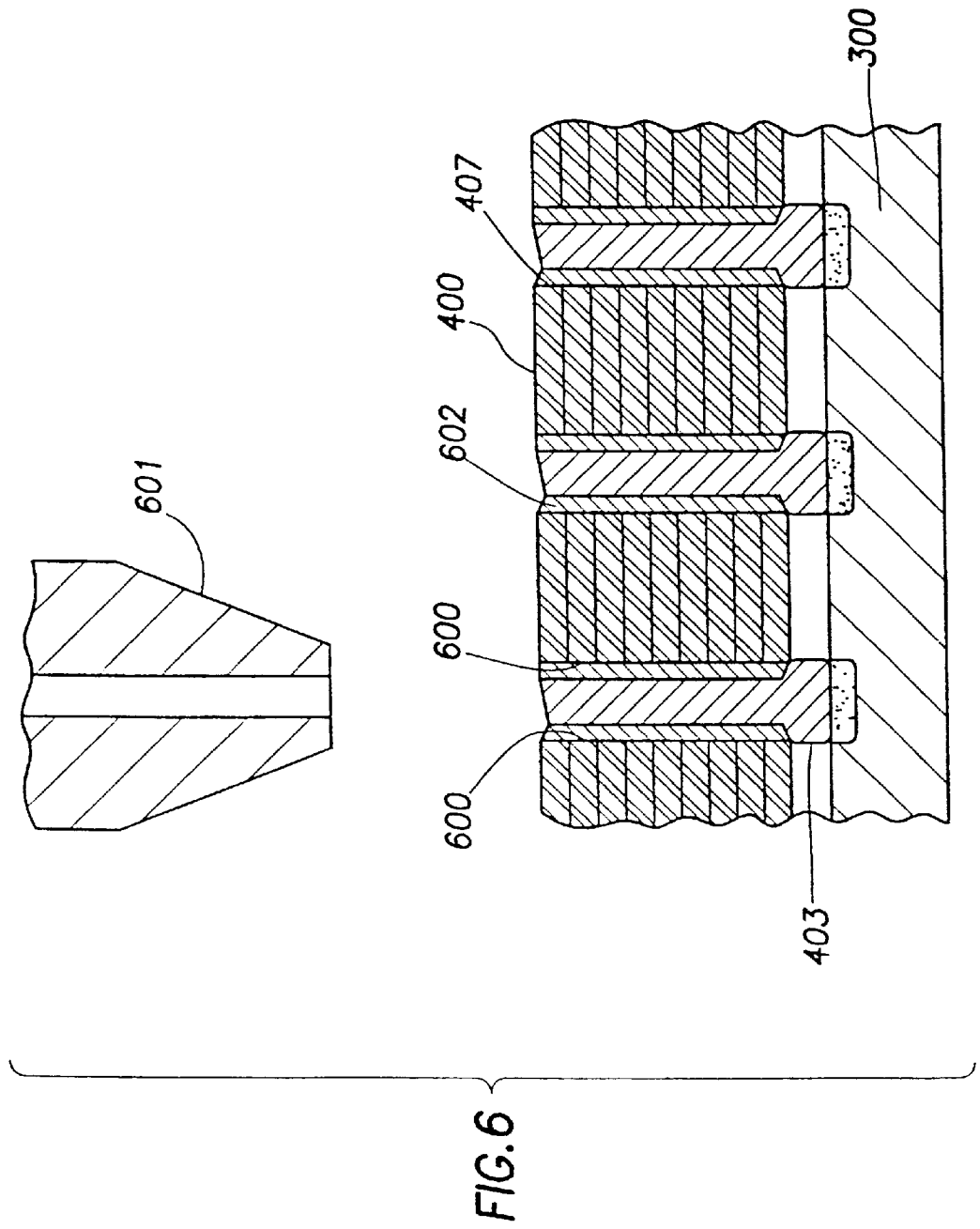
FIG. 6 is a side view illustrating an integrated circuit and printed circuit board after an electrically conductive epoxy adhesive has been applied.

Once the printed circuit board is positioned relative to the integrated circuit, as described above, an electrically conductive epoxy adhesive 602 is then dispensed so as to substantially fill in any existing space between the stem 402 of the flying gold leads 302 and the inner surface 407 of the through holes 401 that surround them, as shown in FIG. 6.

Any suitable electrically conductive epoxy adhesive may be used, such as epoxy adhesives made by such concerns as Epoxy Technology, Inc. of Billerica, Mass.; Ablestik Laboratories of Rancho Dominguez, Calif.; Anneco Products, Inc. of Ossining, N.Y.; and Loctite Corporation of Rocky Hill, Conn. Further, any suitable curing method, such as heat curing, ultraviolet light curing, or air curing may also be used.

As indicated, the epoxy adhesive is dispensed in liquid form into the "barrel" 600 defined by the inner surface 407 of the through hole 401 of the printed circuit board 400 and the seating portion 403 of the gold lead 302. The seating portion 403 prevents the epoxy adhesive from running out of the barrel and onto the active surface of integrated circuit 300. The epoxy adhesive may be dispensed using any of the well-known epoxy adhesive dispensing devices 601, including the use of an electronic fluid dispensing (EFD) station having a manual syringe or needle-type dispenser, or automated dispensing equipment. Suitable dispensing equipment is available from concerns such as Astro Dispense Systems of Franklin, Mass.; Asymtek of Carlsbad, Calif.; Camelot Systems, Inc. of Haverhill, Mass.; and Palomar Products, Inc. of Carlsbad, Calif.

The amount of epoxy adhesive to be dispensed into each barrel is pre-determined and will depend on the size of the barrel and the length of the stem 402 of the flying gold lead 302. Likewise, the curing time and conditions will also be pre-determined and will depend on the epoxy adhesive selected as well as on the other factors mentioned above. Once the epoxy adhesive has been dispensed within the barrels and cured, the integrated circuit is electrically and mechanically coupled to the printed circuit board via the electrically conductive epoxy.

It is readily apparent that the above-described apparatus and method is superior over prior art soldering, stamping, and pressing methods and devices. First, no physical pressure need be applied to effect the electrical and mechanical interconnections. Thus, the bonding pads on the integrated circuit, and the devices themselves, will not be adversely affected. Further, the above-described method does not require the same degree of precision as does the prior art "pressing" method. Any deviations in the length of the stems of the flying gold leads, or any leaning or bending of the stems is not critical as is true in the prior art method. So long as the flying gold leads each extend into the corresponding plated through hole, the electrically conductive epoxy adhesive will fill any voids and ensure a firm electrical and mechanical connection with the leads. Further, the disclosed invention is particularly effective in the case of multilayer printed circuit boards requiring electrical connections between the conductive layers of the board. Finally, an integrated circuit that has been interconnected to a printed circuit board according to the above-described method may readily be removed without causing damage to either device. By simply causing the epoxy adhesive to reflow, such as by the application of heat or ultraviolet light, the integrated circuit can readily be pulled away from the printed circuit board.

Accordingly, the above-described method and apparatus provide an improved way in which to interconnect electronic circuit assemblies or electronic modules. Other modifications of the invention described above will be obvious to those skilled in the art, and it is intended that the scope of the invention be limited only as set forth in the appended claims.

What is claimed is:

1. A method for electrically and mechanically connecting first and second circuit assemblies, the first circuit assembly having a plurality of electrically conducting leads extending therefrom at predetermined positions, the second circuit assembly having a plurality of holes located at predetermined positions corresponding to the predetermined positions of the leads of the first circuit assembly, the leads and the holes electrically connecting to electrical components of the respective first and second circuit assemblies, the leads and the holes each having a cross-sectional size, the cross-sectional size of the holes being greater than the cross-sectional size of the leads, said method comprising the steps of:

positioning the leads in the holes;

inserting an electrically conductive fluid adhesive within each of the holes to occupy space between the smaller cross-sectional sized leads and the larger cross-sectional sized holes; and solidifying the electrically conductive adhesive within the holes into a solid electrical and mechanical connection between the holes and the leads.

2. A method as defined in claim 1, further comprising the step of:

using a curable electrically conductive epoxy as the adhesive; and curing the epoxy to solidify the adhesive.

3. A method as defined in claim 1, further comprising the step of:

occupying substantially all of the volume of the holes not occupied by the leads with the conductive adhesive.

4. A method as defined in claim 3, further comprising the step of:

inserting a predetermined amount of the fluid conductive adhesive into each hole.

5. A method as defined in claim 1, further comprising the step of:

surrounding each lead within the hole with the electrically conductive adhesive.

6. A method as defined in claim 1, further comprising the step of:

confining the electrically conductive adhesive substantially only within the holes.

7. A method as defined in claim 6, further comprising the step of:

surrounding each lead within the hole with the electrically conductive adhesive.

8. a method as defined in claim 1, further comprising the steps of:

disconnecting the leads from the holes by changing the solidified adhesive into a fluid and removing the leads from the holes while the previously solidified adhesive remains a fluid.

9. A method as defined in claim 1, further comprising the steps of:

facilitating positioning the leads in the hole by canting the end of the lead at an acute angle relative to a perpendicular reference from the lead.

10. A method as defined in claim 1, wherein the holes are plated through holes, the second circuit assembly is a printed circuit board, the first circuit assembly is an integrated circuit chip which includes a plurality of bonding pads, and the leads are attached to the bonding pads.

11. A method as defined in claim 10, wherein the leads are formed substantially of gold.

12. A method as defined in claim 1 wherein the second circuit assembly has a pair of opposite first and second surfaces and the holes extend between the surfaces, said method further comprising the steps of:
  extending the leads into the holes from the first surface of the of the second circuit assembly; and
  preventing the conductive adhesive within the holes from extending substantially outward beyond the first surface of the second circuit assembly.

13. A method as defined in claim 12, further comprising the step of:
  preventing the conductive adhesive within the holes from extending substantially outward beyond the second surface of the second circuit assembly.

14. A method as defined in claim 12, further comprising the step of:
  preventing ends of the leads within the holes from extending substantially outward beyond the second surface of the second circuit assembly.

15. A method as defined in claim 12, further comprising the step of:
  prohibiting the fluid conductive adhesive from flowing out of the hole at the first surface of the of the second circuit assembly.

16. A method as defined in claim 15 wherein the leads each include a seating portion connected to the first circuit assembly and a stem portion extending from the seating portion, said method further comprising the steps of:
  extending the stem portion of each lead into a hole;
  forming the seating portion of each lead with a larger cross-sectional size than the corresponding hole into which the stem portion is inserted; and
  inserting the stem portion of each lead into the corresponding hole until the seating portion contacts the hole at the first surface of the second assembly.

17. A method as defined in claim 16, further comprising the step of:
  inserting the conductive adhesive into the hole at the second surface of the second circuit assembly, after the stem portion is inserted into the hole.

18. A method as defined in claim 17, further comprising the step of:
  prohibiting the conductive adhesive from flowing out of the hole at the first surface of the of the second circuit assembly by the contact of the seating portion with the hole at the first surface of the second circuit assembly.

19. A method as defined in claim 18 wherein the first circuit assembly includes a plurality of bonding pads located on a first surface of the first circuit assembly, said method further comprising the steps of:
  connecting the seating portion of each lead to the bonding pad; and
  extending each stem portion substantially perpendicularly from the first surface of the first circuit assembly.

20. A method as defined in claim 19, further comprising the step of:
  preventing ends of the stem portions within the holes from extending substantially outward beyond the second surface of the second circuit assembly.

21. A method as defined in claim 20, further comprising the step of:
  canting the ends of the stem portions within the holes at an acute angle relative to a perpendicular reference to the stem portion.

22. A method as defined in claim 21 wherein the first circuit assembly is an integrated circuit chip, the second circuit assembly is a printed circuit board, and the holes are plated through holes in the printed circuit board.

23. A method as defined in claim 12, further comprising the step of:
  inserting the fluid conductive adhesive into each hole at the second surface of the second circuit assembly.

24. An electronic circuit assembly comprising:
  a first circuit assembly having a plurality of electrically conducting leads extending therefrom at predetermined positions, each lead having a predetermined cross-sectional size, and each lead connecting to an electronic component of the first circuit assembly;
  a second circuit assembly having a plurality of holes located at predetermined positions corresponding to the predetermined positions of the leads of the first circuit assembly, each hole having a predetermined cross-sectional size which is greater than the cross-sectional size of the correspondingly positioned lead, and each hole connecting to an electronic component of the second circuit assembly;
  each lead positioned within the correspondingly positioned hole;
  a solidified electrically conductive fluid adhesive within each of the holes occupying space between the smaller cross-sectional sized leads and the larger cross-sectional sized holes, the solidified fluid adhesive electrically and mechanically bonding the leads in the holes.

25. An electronic circuit assembly as defined in claim 24 wherein the adhesive is a electrically conductive epoxy which cures into solidified form.

26. An electronic circuit assembly as defined in claim 25, wherein the epoxy has characteristics which allow it to reflow into a fluid after having previously been cured into a solid.

27. An electronic circuit assembly as defined in claim 24, wherein the solidified fluid adhesive occupies substantially all of the volume of the holes not occupied by the leads.

28. An electronic circuit assembly as defined in claim 24, wherein the solidified fluid adhesive surrounds each lead within the hole.

29. An electronic circuit assembly as defined in claim 24, wherein the solidified fluid adhesive is confined substantially only within the holes.

30. An electronic circuit assembly as defined in claim 24, wherein ends of the leads are canted at an acute angle relative to a perpendicular reference from the lead.

31. An electronic circuit assembly as defined in claim 24, wherein:
  the first circuit assembly is an integrated circuit chip having bonding pads, and the leads each include a seating portion connected to a bonding pad and a stem portion extending from the seating portion, the seating portion of each lead having a larger cross-sectional size than the corresponding hole into which the lead is inserted;
  the second circuit assembly is a printed circuit board having first and second opposite surfaces, and the holes are plated through holes formed in the printed circuit board extending between the first and second surfaces;

the stem portion of each lead is inserted into the corresponding plated through hole from the first surface of the printed circuit board; and the seating portion of each lead contacts the plated through hole at the first surface of the printed circuit board.

32. An electronic circuit assembly as defined in claim 31, wherein the contact of the seating portion with the plated through hole prevents fluid adhesive from flowing from the plated through hole at the first surface of the printed circuit board.

33. An electronic circuit assembly as defined in claim 31, wherein the stem and seating portions of the leads are formed substantially of gold.

34. An electronic circuit assembly as defined in claim 31, wherein the length of the stem portion of the leads is predetermined to locate an end of the stem portion at a position not extending outward substantially beyond the second surface of the printed circuit board when the seating portion contacts the plated through hole at the first surface of the printed circuit board.

35. An electronic circuit assembly as defined in claim 34, wherein the end of each stem portion is canted at an acute angle relative to a perpendicular reference to the stem portion.

* * * * *